United States Patent [19] [11] 4,310,965
Horiuchi et al. [45] Jan. 19, 1982

[54] PROCESS FOR PRODUCING A DIELECTRIC INSULATOR SEPARATED SUBSTRATE

[75] Inventors: Junichiro Horiuchi; Hideyuki Yagi, both of Ibaraki, Japan

[73] Assignee: Hitachi, Ltd., Tokyo, Japan

[21] Appl. No.: 138,992

[22] Filed: Apr. 10, 1980

[30] Foreign Application Priority Data

Apr. 13, 1979 [JP] Japan .................................. 54-44365

[51] Int. Cl.³ .................... H01L 21/304; H01L 21/76
[52] U.S. Cl. .................................. 29/580; 29/576 W;
148/1.5; 148/174; 156/631; 156/645; 156/649;
156/662; 357/49; 357/54; 357/56; 357/59;
427/93
[58] Field of Search .................. 148/1.5, 174, 187;
427/93, 95; 29/576 W, 580; 357/49, 59, 54, 55;
156/631, 662, 649, 645

[56] References Cited

U.S. PATENT DOCUMENTS

| 3,574,007 | 4/1971 | Hugle | 148/175 |
| 3,624,463 | 11/1971 | Davidsohn | 29/576 X |
| 3,655,439 | 4/1972 | Seiter | 148/175 X |
| 3,826,699 | 7/1974 | Sawazaki et al. | 29/580 X |
| 3,862,852 | 1/1975 | Kamins | 148/174 X |
| 3,967,309 | 6/1976 | Miyata | 357/55 X |
| 4,017,341 | 4/1977 | Suzuki et al. | 148/174 |
| 4,079,506 | 3/1978 | Suzuki et al. | 148/174 X |
| 4,173,674 | 11/1979 | Mimura et al. | 357/59 X |

Primary Examiner—L. Dewayne Rutledge
Assistant Examiner—W. G. Saba
Attorney, Agent, or Firm—Craig and Antonelli

[57] ABSTRACT

An improved dielectric insulator separated substrate for semiconductor integrated circuits is obtained by forming a lamination of at least three thin-polycrystalline layers and dielectric films interposed therebetween on a thick polycrystalline layer of the substrate. A thickness x(μm) of each of the thin-polycrystalline layers is represented by the formula:

$$x \leq y/40$$

where y is an ultimate thickness of the substrate. By employing the lamination, it is possible to avoid curveness deformation of the substrate due to oxygen diffusion into an exposed polycrystalline layer during doping of an impurity into island regions independently supported by said thick polycrystalline layer.

14 Claims, 2 Drawing Figures

PROCESS FOR PRODUCING A DIELECTRIC INSULATOR SEPARATED SUBSTRATE

BACKGROUND OF THE INVENTION

This invention relates to a dielectric insulator separated substrate for semiconductor integrated circuits, which includes a large number of monocrystalline semiconductor island regions in which circuit elements are to be formed and a polycrystalline semiconductor support region for supporting fixedly the island regions.

In a semiconductor integrated circuit, circuit elements such as resistors, diodes, transistors, thyristors and the like may be formed integrally in island regions while being required to be electrically separated from each other. For this, a large number of island regions are electrically insulated from each other and from a support region which supports them. One of the insulating methods uses dielectric materials and a substrate prepared according to this method is called a dielectric insulator separated substrate (hereinafter referred simply to as DI substrate).

The DI substrate, however, undergoes curveness deformations during its preparation process and upon the production of semiconductor integrated circuits. The deformation brings about various defects including cracks in the substrate, degraded accuracy of metal deposition for the electrodes, degradation of the withstand voltage and fluctuations in characteristics of the circuit elements.

The U.S. Pat. Nos. 4,017,341; 4,079,506; 3,967,309; and 4,173,674 assigned to the same assignee of the present application describe in detail causes for the curveness deformations of the DI substrate and propose a countermeasure therefor. There are two types of curveness deformations of the DI substrate. In one type, the DI substrate is deformed convexly toward the side of the monocrystalline semiconductor island regions. In the other type, the DI substrate is deformed convexly toward the side of the polycrystalline semiconductor support region. The curveness deformation of the former type is caused by the difference in thermal expansion coefficient between the monocrystalline island regions and the polycrystalline support region. In the latter type, the deformation results from the wedge action due to oxygen diffused into the polycrystalline support region during a diffusion step of p- or n-type impurity into desired parts of mono-crystalline island regions.

The prior patents set forth above proposed to provide a film for preventing the diffusion of oxygen into the surface of the polycrystalline layer of the support region and/or a film for compensating for the difference in thermal expansion coefficient between the island regions and the support region.

U.S. Pat. No. 4,173,674 proposes the provision of a thin polycrystalline outer layer. The thin polycrystalline outer layer is formed by reducing a thick polycrystalline layer. The thickness of the outer layer before reducing its thickness is generally at least 30 μm. If this thickness is too small, part of an inner thick polycrystalline layer may be exposed by reducing the thickness, which is caused by the curveness of the substrate. When the thick inner polycrystalline layer is exposed, the substrate will be deformed by the action of oxygen during the doping step of an impurity.

In general the ultimate thickness of the substrates is about 400 to 500 μm. The substrates produced by the process disclosed in, such as, U.S. Pat. No. 4,173,674 have a curveness of 60 to 100 μm, when a diameter of the substrate is 50 mm. After the polishing of the monocrystalline layer to form the island regions, the opposite face of the substrate is polished to obtain a flat surface. In order to carry out the second polishing, i.e. the reduction in thickness of the polycrystalline layer, the substrate, which has been subjected to the first polishing, i.e. the formation of island regions is supported by suction; however, there remains a curveness of about 20 μm.

Since the partial growth of the polycrystalline layer tends to occur, the over-all difference in thickness of the substrate becomes about 30 μm or more. The difference in local thickness of the substrate will increase as the diameter of the substrate increases. Accordingly, if the outer polycrystalline layer is 30 μm thick or more, which is considered to be a sufficient thickness to cover the local difference of the substrate, there is a possibility that a part of the thick polycrystalline outer layer may remain unpolished. Therefore, the remaining thick polycrystalline outer layer can be a cause of deformation of the substrate due to oxygen diffusion during the doping step of an impurity.

It is an object of the present invention to provide a process of manufacturing a dielectric separated substrate by which a possibility of remaining a thick polycrystalline outer layer is eliminated.

The present invention consists in that a lamination of thin polycrystalline layers and dielectric films interposed therebetween is formed on a thick inner polycrystalline layer through a dielectric film. According to a process for producing a polycrystalline layer on a dielectric layer in gas phase, such as disclosed in U.S. Pat. No. 4,017,341, thin polycrystalline layers each of which is 10 μm thick can be produced. Therefore, if more than three layers of such lamination are provided, although the thickness of about 30 μm is reduced in order to obtain the substrate with a flat surface, a part of the lamination of the thin polycrystalline layers still remains and the polycrystalline layer of less than 10 μm is exposed. Accordingly, the exposure of the thick inner polycrystalline layer, which adjoins the remaining thin outer polycrystalline layers through a dielectric film, can be avoided. The entire thickness of the lamination is necessary to cover the thickness for machining which is determined by a local difference in the thickness and the machining tolerance.

Other objects and features of the present invention will be apparent from the following description, taken in conjunction with the accompanying drawings in which:

DETAILED DESCRIPTION OF PREFERRED EMBODIMENT

Figure 1:
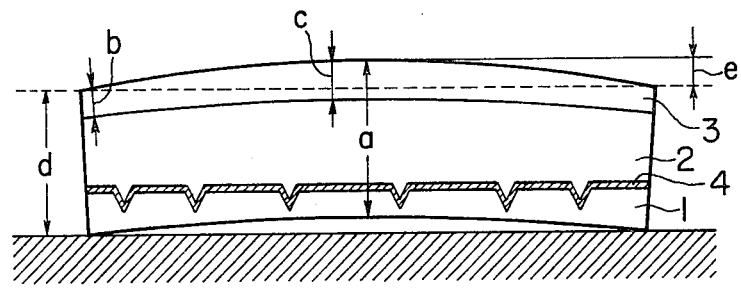
FIG. 1 is an explanatory view of a substrate showing a curveness deformation and thicknesses of various parts.

As shown in FIG. 1, a substrate of the present invention consists of a monocrystalline silicon 1, a polycrystalline silicon 2 susperimposed on a dielectric film 4 and a lamination 3. The lamination 3 consists of at least 3 layers of polycrystalline silicon and dielectric films interposed between the layers.

The substrate has a curveness deformation as shown in FIG. 1, and thickness a is generally slightly larger than thickness d, because there is a tendency that a thickness c of polycrystalline silicon in the center part of the wafer is larger than that b in the peripheral part. In order to obtain a flat face designated by a dotted line, the lamination should be machined or polished to the extent of e.

Figure 2:
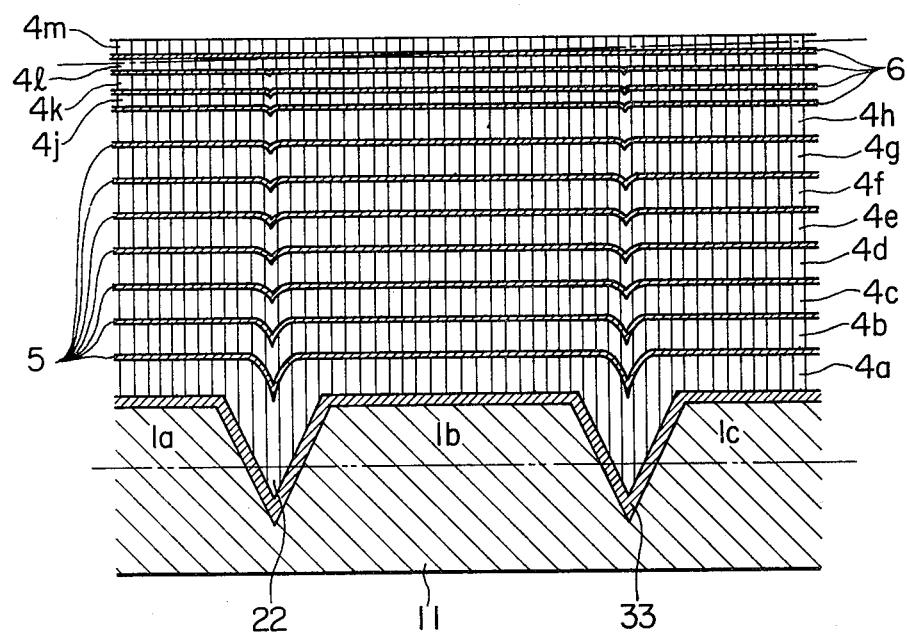
FIG. 2 is a partial section view of a substrate according to one embodiment of the present invention.

In FIG. 2 polycrystalline layer 4a is grown by a process such as disclosed in U.S. Pat. No. 4,017,341 or 4,079,506 on a dielectric film 33 such as silicon dioxide film. The dielectric film is formed by a thermal oxidation process, for example, on the surface of the monocrystalline wafer 11 having grooves 22. The silicon dioxide film 33 functions as an insulating film, so it should have a thickness sufficient to withstand a potential applied integrated circuits to be formed in island regions 1a-1c.

After the formation of the first polycrystalline layer, dielectric films 5 (such as silicon dioxide film) and polycrystalline layers 4b-4h are alternately formed by a process disclosed in U.S. Pat. No. 4,079,506 or 4,017,341, for example. According to U.S. Pat. No. 4,079,506, the alternate lamination of polysilicon layers and silicon dioxide films can reduce the curveness deformation of the resulting substrate. The U.S. Pat. No. 4,079,506 proposes that the numbers of polycrystalline layers and dielectric films should be 3 to 12. In FIG. 2, the number of the polycrystalline layers is 8. In one example a thickness of each of the polycrystalline layers 4a-4h was 50 μm and that of each of dielectric films 5 was 0.5 μm.

There is another method to reduce the curveness deformation of the resulting substrate in which a certain amount of oxygen is doped into the polycrystalline layer during the formation of the layer. In this process the number of the polycrystalline layer can be made smaller than that proposed by the U.S. Pat. No. 4,079,506. Typically, only one layer doped with oxygen having a sufficient thickness can satisfy the requirement.

After the formation of the lamination or a single polycrystalline layer, a lamination consisting of thin polycrystalline layers 4j-4m and dielectric films 6 is formed in the same manner as disclosed in such as U.S. Pat. No. 4,017,341, 4,079,506, or 4,173,674. As described in U.S. Pat. No. 4,173,674, the thickness x (μm) of each of the polycrystalline layers 4j-4m is desirable to be selected so as to meet the relation x≦y/40, where y (μm) represents the ultimate thickness of the substrate. In an example of FIG. 2, the thickness x was 13 μm and a thickness of one dielectric film (SiO₂) 6 was 0.4 μm. And, in the example of FIG. 2 the number of the thin polycrystalline layers was 4. Accordingly, the total thickness of the outer lamination was 53.2 μm (13 μm×4+0.4 μm×3).

After the formation of the outer lamination, the lamination of the resulting substrate was subjected to machining (polishing) to obtain a flat face designated by a chained line. During the machining (polishing) the monocrystalline substrate was supported by a vacuum chuck (not shown). A vacuum chuck is used not only to support the substrate, but to make the substrate flat. The supported substrate had a curveness of 20 μm. The polishing was conducted to reduce the thickness of the lamination to about 40 μm at the maximum as shown by the chained line. By employing the outer lamination described hereinbefore, a danger of exposure of a thick polycrystalline layer is completely avoided because the thickness of the polycrystalline layers can be made very small.

As a result, the cause of curveness deformation due to oxygen diffused into the outer polycrystalline layer is avoided, even when there are a local difference in thickness of the substrate and a machining tolerance. In case of the technique disclosed in U.S. Pat. No. 4,173,674, the outer polysilicon layer needs a thickness to cover the machining tolerance and the local difference in thickness of the substrate. Accordingly, the thickness of the outer polycrystalline layer should be about 30 μm or more. If such the thick outer polycrystalline layer is exposed after polishing, the layer can be a cause of curveness deformation of the substrate due to oxygen diffused into the layer.

However, in the present invention, the curveness deformation is neglectable because the thickness of each of the polycrystalline layers is very small and the thickness of the lamination can cover the local thickness difference of the substrate and machining tolerance.

After the polishing of the outer lamination, the substrate was turned over and supported on a supporter by means of a vaccum chuck. Then, the monocrystalline layer 11 was polished to the extent shown by two dotted line to form island regions 1a-1c each being surrounded by a dielectric film 22. The thus prepared substrate was subjected to a desired doping step to form desired circuit components in the island regions. After the doping step, substantially no deformation due to oxygen diffusion into the outer polycrystalline layer was observed. Accordingly, a high precision circuit pattern could be expected by using the substrate of the present invention.

Main advantages of the present inventions are as follows:

(1) It is possible to eliminate curveness deformation due to oxygen diffusion into a polycrystalline layer during the impurity doping into island regions.

(2) It is possible to shorten the machining time for obtaining a flat face on the side of the lamination of thin-polycrystalline layers. Because each of the layers can have the minimum thickness, the machining of the lamination can be finished if a flat surface is obtained. In case of U.S. Pat. No. 4,173,674, the outer polycrystalline layer must have a thickness to cover a local difference in thickness of the substrate and curvature remaining in the substrate as well as a machining tolerance.

What we claim is:

1. In a process for producing a dielectric insulator separated substrate for semiconductor integrated circuits comprising preparing a composite which comprises a monocrystalline layer and a first polycrystalline film, having at least one polycrystalline layer, superposed through a dielectric film for electrically isolating therebetween, the first polycrystalline film having a thickness sufficient to support island regions to be formed therein, the improvement which comprises forming a lamination of second polycrystalline layers and second dielectric films interposed therebetween on the first polycrystalline film through a third dielectric film, each of said second polycrystalline layers having a thickness that is sufficiently thinner than that of said first polycrystalline film such that deformation of the substrate due to action of oxygen is avoided, and with the thickness of said lamination being capable of covering a machining tolerance for machining of the lamination to produce a flat surface thereon.

2. A process as defined in claim 1, wherein the thickness x(μm) of each of the second polycrystalline layers is represented by the formula:

$$x \leq y/40$$

where y represents the ultimate thickness (μm) of said substrate.

3. A process as defined in claim 1, wherein said second dielectric films are of silicon dioxide.

4. A process for producing a dielectric insulator separated substrate for semiconductor integrated circuits, which comprises the steps of:
  forming grooves in one face of a wafer of monocrystalline silicon to define island regions,
  covering the whole exposed surface of the one face with a first dielectric film for electric insulation,
  forming at least one first layer of polycrystalline silicon on said first dielectric film, said at least one first layer having a thickness sufficient to support said island regions,
  forming a lamination of second thin layers of polycrystalline silicon and second dielectric films, each second dielectric film being interposed between said second thin layers, on said first layer through a third dielectric film, each of said second thin layers having a thickness x(μm) represented by the formula:

$$x \leq y/40$$

where y(μm) is the ultimate thickness of the substrate, said lamination being sufficiently thick to cover a machining tolerance for machining the lamination,
  subjecting the lamination to machining to produce a flat surface without exposing the surface of said first layer, and
  subjecting the face of the monocrystalline silicon wafer opposite to said one face to machining to form said island regions each being surrounded by said polycrystalline silicon through said first dielectric film.

5. A process as defined in claim 4, wherein the number of said second thin layers is 3 to 8.

6. A process as defined in claim 4, wherein said first dielectric film is of silicon dioxide, silicon nitride, aluminium oxide or combination thereof.

7. A process as defined in claim 4, wherein said second dielectric films are of silicon dioxide, silicon nitride, aluminum oxide or combination thereof.

8. A process as defined in claim 1, wherein said first polycrystalline film is a lamination of a plurality of polycrystalline layers with dielectric films interposed between said polycrystalline layers.

9. A process as defined in claim 8, wherein each of said second polycrystalline layers has a thickness which is much thinner than the thickness of each of said plurality of polycrystalline layers.

10. A process as defined in claim 4, wherein said at least one first layer is a lamination of a plurality of polycrystalline silicon layers having dielectric films interposed between said polycrystalline silicon layers.

11. A process as defined in claim 4, wherein each of said second thin layers has a thickness which is sufficiently thinner than said at least one first layer such that deformation of the substrate due to action of oxygen is avoided.

12. A process as defined in claim 1, wherein said first polycrystalline film is a single polycrystalline layer.

13. A process as defined in claim 4, wherein said at least one first layer of polycrystalline silicon is a single polycrystalline silicon layer.

14. A process as defined in claim 1 or 4, wherein said lamination is sufficiently thick to cover a local difference in thickness of the substrate as well as the machining tolerance.

* * * * *